United States Patent
Zhang et al.

(10) Patent No.: US 10,147,762 B2
(45) Date of Patent: Dec. 4, 2018

(54) PROTECTIVE ELEMENTS FOR NON-VOLATILE MEMORY CELLS IN CROSSBAR ARRAYS

(71) Applicant: Hewlett Packard Enterprise Development LP, Houston, TX (US)

(72) Inventors: Minxian Max Zhang, Palo Alto, CA (US); Jianhua Yang, Palo Alto, CA (US); R. Stanley Williams, Portola Valley, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/316,762

(22) PCT Filed: Jun. 26, 2014

(86) PCT No.: PCT/US2014/044265
§ 371 (c)(1),
(2) Date: Dec. 6, 2016

(87) PCT Pub. No.: WO2015/199692
PCT Pub. Date: Dec. 30, 2015

(65) Prior Publication Data
US 2017/0141160 A1    May 18, 2017

(51) Int. Cl.
*H01L 45/00* (2006.01)
*H01L 27/24* (2006.01)
*H01L 27/02* (2006.01)

(52) U.S. Cl.
CPC ...... *H01L 27/2463* (2013.01); *H01L 27/0248* (2013.01); *H01L 27/2409* (2013.01); *H01L 27/2418* (2013.01); *H01L 45/08* (2013.01); *H01L 45/1233* (2013.01); *H01L 45/146* (2013.01); *H01L 45/1675* (2013.01)

(58) Field of Classification Search
CPC ............. H01L 27/2463; H01L 45/1233; H01L 27/2418; H01L 27/24; H01L 45/08; H01L 27/101; H01L 45/128; H01L 45/1293
See application file for complete search history.

(56) References Cited

U.S. PATENT DOCUMENTS 6,785,159 B2   8/2004 Tuttle
8,351,250 B2   1/2013 Lowrey
(Continued)

FOREIGN PATENT DOCUMENTS

JP   2011-040613 A   2/2011
KR   2010-0090586 A  8/2010
KR   2012-0071257 A  7/2012

OTHER PUBLICATIONS

International Searching Authority, International Search Report and Written Opinion, PCT/US2014/044265, dated Mar. 24, 2015, 12 pages.
(Continued)

*Primary Examiner* — Frederick B Hargrove
(74) *Attorney, Agent, or Firm* — Michael A. Dryja

(57) ABSTRACT

Protective elements are provided for non-volatile memory cells in crossbar arrays in which each memristor is situated at a crosspoint of the array. Each memristor is provided with a protective element. The protective element includes a layer of a first oxide that upon heating converts to a second oxide having a higher resistivity than the first oxide.

14 Claims, 4 Drawing Sheets

(56) References Cited

U.S. PATENT DOCUMENTS

| | | | |
|---|---|---|---|
| 8,525,553 B1* | 9/2013 | Yi | H03K 3/313 |
| | | | 326/132 |
| 8,605,484 B2 | 12/2013 | Borghetti et al. | |
| 2009/0289251 A1* | 11/2009 | Kiyotoshi | H01L 27/1021 |
| | | | 257/43 |
| 2011/0261608 A1* | 10/2011 | Borghetti | G11C 13/0007 |
| | | | 365/148 |
| 2012/0099362 A1* | 4/2012 | Ribeiro | G11C 13/0007 |
| | | | 365/148 |
| 2013/0134382 A1 | 5/2013 | Martens et al. | |
| 2013/0214231 A1 | 8/2013 | Lee | |
| 2013/0322153 A1 | 12/2013 | Burr et al. | |
| 2014/0361864 A1* | 12/2014 | Fukuda | C23C 14/0036 |
| | | | 338/20 |

OTHER PUBLICATIONS

Lu, W. et al, Two-terminal Resistive Switches (Memristors) for Memory and Logic Applications, Dec. 8, 2010, 7 Pgs.

\* cited by examiner

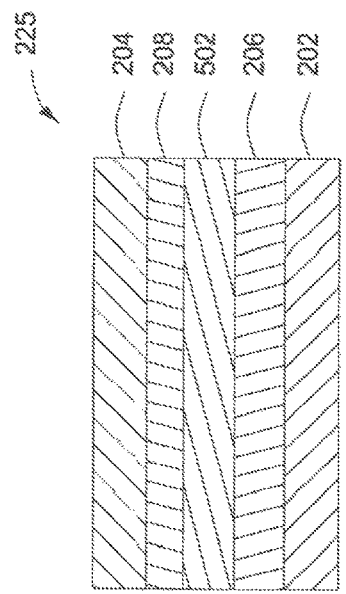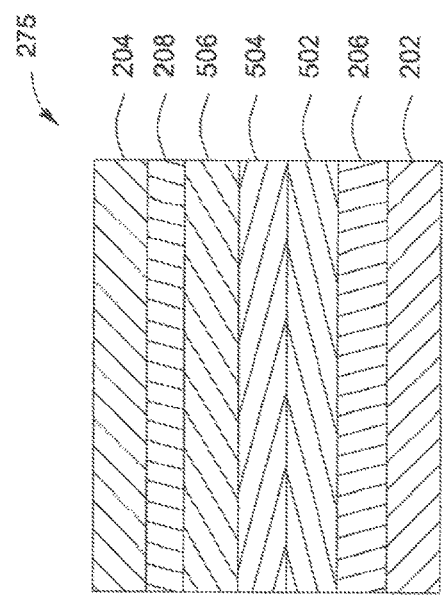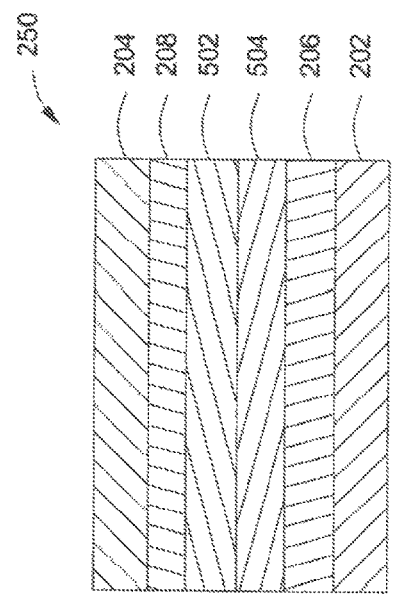

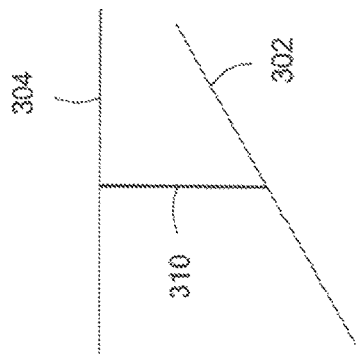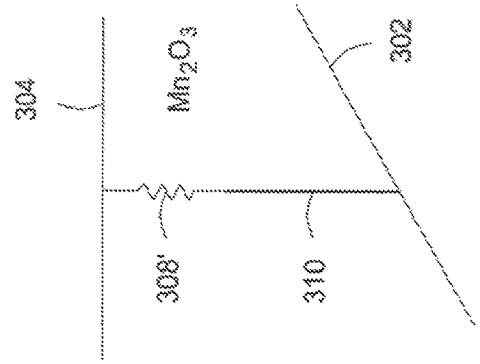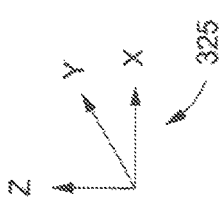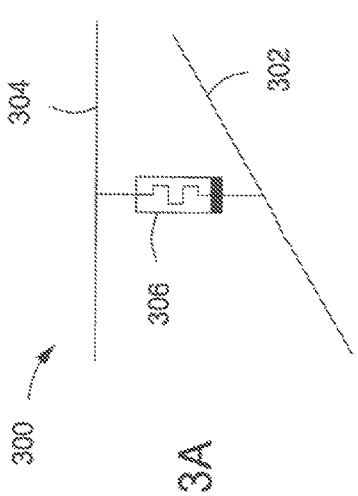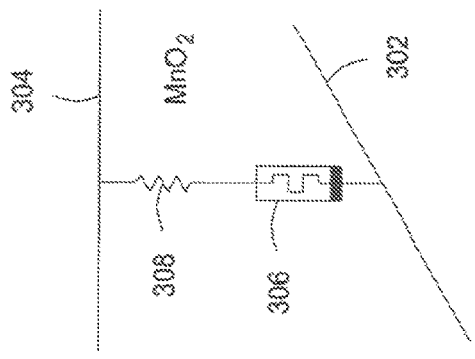
FIG. 3A
FIG. 3B
FIG. 3C
FIG. 3D

PROTECTIVE ELEMENTS FOR NON-VOLATILE MEMORY CELLS IN CROSSBAR ARRAYS

BACKGROUND

Non-volatile memory is computer memory that can get back stored information even when not powered. Types of non-volatile memory may include resistive RAM (random access memory) (RRAM or ReRAM), phase change RAM (PCRAM), conductive bridge RAM (CBRAM), ferroelectric RAM (F-RAM), etc.

Resistance memory elements, such as resistive RAM, or ReRAM, can be programmed to different resistance states by applying programming energy. After programming, the state of the resistive memory elements can be read and remains stable over a specified time period. Large arrays of resistive memory elements can be used to create a variety of resistive memory devices, including non-volatile solid state memory, programmable logic, signal processing, control systems, pattern recognition devices, and other applications. Examples of resistive memory devices include valence change memory and electrochemical metallization memory, both of which involve ionic motion during electrical switching and belong to the category of memristors.

Memristors are devices that can be programmed to different resistive states by applying a programming energy, for example, a voltage or current pulse. This energy generates a combination of electric field and thermal effects that can modulate the conductivity of both non-volatile switch and non-linear select functions in a memristive element. After programming, the state of the memristor can be read and remains stable over a specified time period.

BRIEF DESCRIPTION OF THE DRAWINGS

FIG. 2 is a cross-sectional view of a memristor including a fuse, or protective element, according to an example.

FIGS. 3A-3D are schematic representations, in perspective, of the effects of the absence or presence of a protective element in series with a non-volatile memory cell, specifically, a memristor, in a crossbar array, according to an example.

FIGS. 5A-5C are each a cross-sectional view of alternate non-volatile memory cell structures, specifically, memristor structures, in series with a protective element, according to an example.

DETAILED DESCRIPTION

Figure 1:
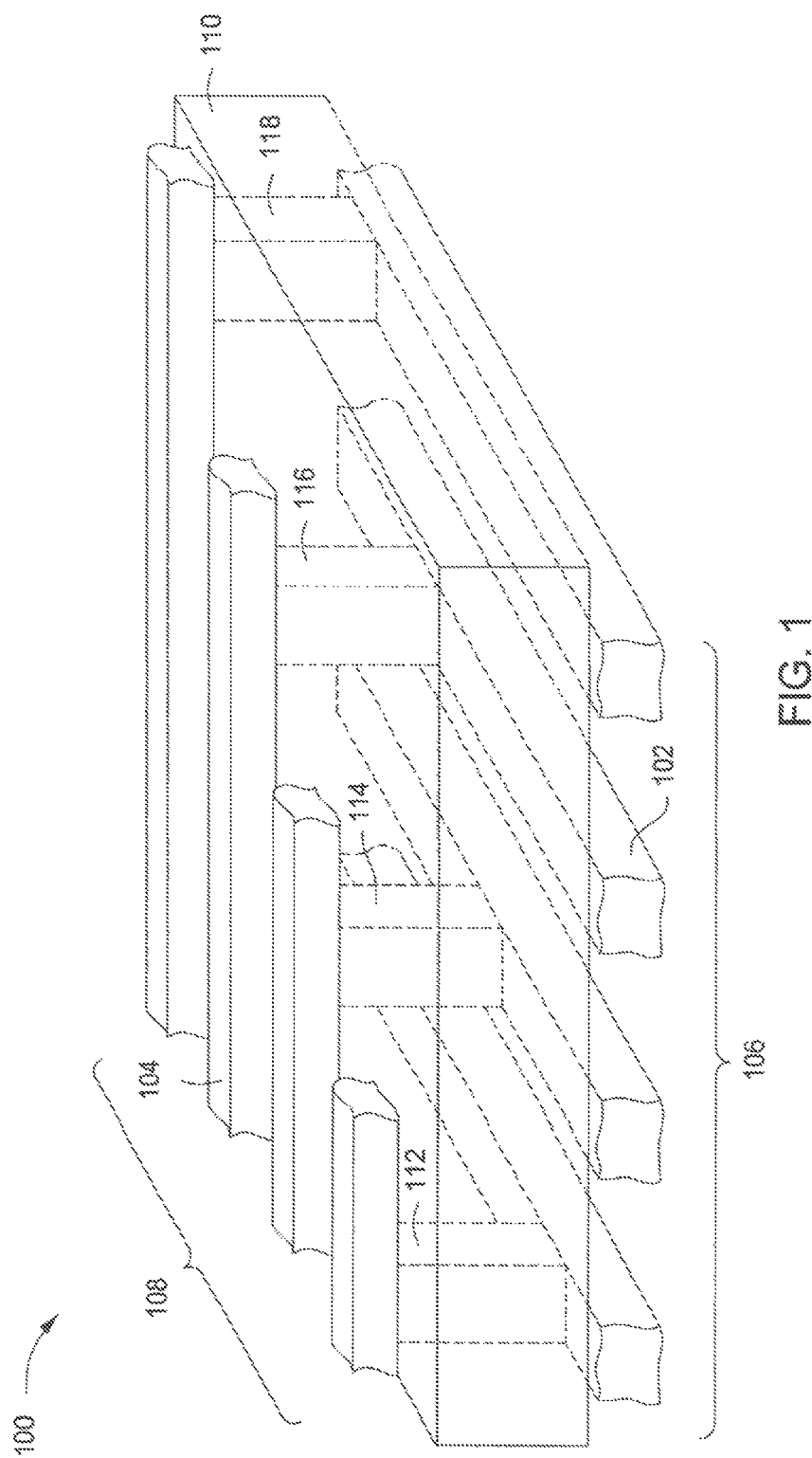
FIG. 1 is a perspective view of a crossbar memory array, according to an example.

In the following description, numerous specific details are set forth to provide a thorough understanding of the examples. However, it will be appreciated that the examples may be practiced without limitation to these specific details. In other instances, well-known methods and structures may not be described in detail to avoid unnecessarily obscuring the description of the examples. Also, the examples may be used in combination with each other.

While a limited number of examples have been disclosed, it should be understood that there are numerous modifications and variations therefrom. Similar or equal elements in the Figures may be indicated using the same numeral.

As used in the specification and claims herein, the singular forms "a," "an," and "the" include plural referents unless the context clearly dictates otherwise.

As used in this specification and the appended claims, "approximately" and "about" mean a ±10% variance caused by, for example, variations in manufacturing processes.

In the following detailed description, reference is made to the drawings accompanying this disclosure, which illustrate specific examples in which this disclosure may be practiced. The components of the examples can be positioned in a number of different orientations and any directional terminology used in relation to the orientation of the components is used for purposes of illustration and is in no way limiting. Directional terminology includes words such as "top," "bottom," "front," "back," "leading," "trailing," etc.

It is to be understood that other examples in which this disclosure may be practiced exist, and structural or logical changes may be made without departing from the scope of the present disclosure. Therefore, the following detailed description is not to be taken in a limiting sense. Instead, the scope of the present disclosure is defined by the appended claims.

Non-volatile memory elements, or cells, can be used in a variety of applications, such as read-only memory, reprogrammable memory, and other uses where long term persistent storage is required.

Resistive memory elements, or cells, can be used in a variety of applications, including non-volatile solid state memory, programmable logic, signal processing, control systems, pattern recognition, and other applications.

As used in the specification and appended claims, the term "resistance memory elements" or "resistance memory cells" refers broadly to programmable non-volatile resistors where the switching mechanism involves atomic motion and rearrangement, including memristors, valance change memory, electrochemical metallization memory, and others.

Memristors, or memristive devices, are nano-scale devices that may be used as a component in a wide range of electronic circuits, such as memories, switches, and logic circuits and systems. By "nano-scale" is meant that at least the critical dimension of the device is measured in nanometers (nm), tens of nanometers, or hundreds of nanometers. In a memory structure, a crossbar of memristors may be used. For example, when used as a basis for memories, the memristor may be used to store a bit of information, 1 or 0, corresponding to whether the memristor is in its high or low resistance state (or vice versa). When used as a logic circuit, the memristor may be employed as configuration bits and switches in a logic circuit that resembles a Field Programmable Gate Array, or may be the basis for a wired-logic Programmable Logic Array. It is also possible to use memristors capable of multi-state or analog behavior for these and other applications.

When used as a switch, the memristor may either be in a low resistance (closed) or high resistance (open) state in a crosspoint memory. During the last few years, researchers have made great progress in finding ways to make the switching function of these memristors behave efficiently. For example, tantalum oxide ($TaO_x$)-based memristors have been demonstrated to have superior endurance over other nano-scale devices capable of electronic switching. In lab settings, tantalum oxide-based memristors are capable of over 10 billion switching cycles.

A memristor may comprise a switching material, such as $TiO_x$ or $TaO_x$, sandwiched between two electrodes. Memristive behavior is achieved by the movement of ionic species (e.g., oxygen ions or vacancies) within the switching material to create localized changes in conductivity via modulation of a conductive filament between two electrodes, which results in a low resistance "ON" state, a high resistance "OFF" state, or intermediate states. Initially, when the memristor is first fabricated, the entire switching material may be nonconductive. As such, a forming process may be required to form the conductive channel in the switching material between the two electrodes. A known forming process, often called "electroforming", includes applying a sufficiently high (threshold) voltage across the electrodes for a sufficient length of time to cause a nucleation and formation of a localized conductive channel (or active region) in the switching material. The threshold voltage and the length of time required for the forming process may depend upon the type of material used for the switching material, the first electrode, and the second electrode, and the device geometry.

Metal or semiconductor oxides may be employed in memristive devices; examples include either transition metal oxides, such as tantalum oxide, titanium oxide, yttrium oxide, hafnium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include transition metal nitrides, such as aluminum nitride, gallium nitride, tantalum nitride, and silicon nitride.

One of the memristor failure modes is memristor failure at a low resistance state to form a short circuit between a top electrode and a bottom electrode. If the shorted memristor is an individual component, one can simply discontinue its usage. However, in a crossbar memristor array, a shorted memristor can cause extensive damage to the whole crossbar array by directing all currents through the short path.

In accordance with the teachings herein, protection of the crossbar memristor array is provided when one of the memristors fails at a low resistance state. Specifically, protection is afforded by using a first oxide that upon heating converts to a second oxide having a higher resistivity than the first oxide. In a broader context, protective elements are provided for non-volatile memory cells in crossbar arrays in which each non-volatile memory cell is situated at a crosspoint of the array. Each non-volatile memory cell, e.g., memristor, is provided with a protective element, or fuse, which is the first oxide.

$MnO_2$ may be used as a self-triggered protective element, or resistor, in series with the memristor. When the memristor, or, more generally, the resistance memory element, fails, the joule heat at the junction may automatically transform $MnO_2$ to $Mn_2O_3$, whose resistivity is 4 to 5 orders of magnitude, or 10,000 to 100,000 times, higher than that of $MnO_2$. The byproduct of the reaction, oxygen gas, can also be used to delaminate the electrode to create an open circuit at the defective junction, therefore protecting the remaining crossbar array.

Broadly speaking, an oxide or nitride used as a protective element may have a low resistance at low temperature, and self-convert to a high resistance oxide or nitride at high temperature. This means that $\Delta G>0$ at low temperature and $\Delta G$ has a negative temperature slope (or positive $\Delta S$), where $\Delta G$ is the Gibbs free energy and $\Delta S$ is the entropy of the reaction. Since the $\Delta S$ of a reaction is dominated by the gas phase (gas is much more random than solid or liquid), then the right hand side of the reaction may have gas phase ($O_2$ or $N_2$) to make $\Delta S>0$.

The band gap for $MnO_2$ is ~0.26 eV, while the band gap for $Mn_2O_3$ is ~2.6 eV. This is quite a unique pair in terms of the fact that the resistance increases with decreasing oxygen content in the metal oxide, which is usually opposite for other metal oxides (and metal nitrides as well). Anything that has a similar property may be used in place of the $MnO_2$ and $Mn_2O_3$ pair. The band gap for FeO is 2.4 eV, while the band gap for $Fe_2O_3$ is 1.9 eV and thus FeO may be more resistive than $Fe_2O_3$; accordingly, $FeO/Fe_2O_3$ may be another pair of materials with a similar behavior.

The thermodynamic properties of $MnO_2$ and $Mn_2O_3$ are shown in Table I below. The values are taken from "Materials Thermochemistry, 6th Edition" by Kubaschewski, Alcock and Spencer.

TABLE I

Thermodynamic Properties of $MnO_2$ and $Mn_2O_3$.

|  | $\Delta H_{298K}$, KJ/mol | $S_{298K}$, J/deg-mol |
|---|---|---|
| $MnO_2$ | −520.9 | 53.1 |
| $Mn_2O_3$ | −958.1 | 110.5 |
| Mn | 0 | 32 |
| $O_2$ | 0 | 205.1 |

Reaction (1) below shows the chemical reaction between $MnO_2$ and $Mn_2O_3$:

$$2MnO_2 = Mn_2O_3 + \tfrac{1}{2}O_2. \qquad (1)$$

The enthalpy for Reaction (1) is given by $\Delta H_{298K} = 83.7$ kJ/mol.

The entropy for Reaction (1) is given by $\Delta S_{298K} = 209.4$ J/deg-mol.

The free energy for Reaction (1) is given by $\Delta G = 83{,}700 - 209.4T$ J.

The free energy for Reaction (1) is positive at ambient temperature and becomes negative when temperature is higher than 127° C., as shown below:

$\Delta G < 0$ when $T > 400K$ (127° C.). 

This is consistent with literature observation that the transformation will occur at about several hundred degree Celsius The resistivity values of $MnO_2$ and $Mn_2O_3$ are compared in Table II below. For further comparison, the resistivity values of tantalum metal and manganese metal are also included.

TABLE II

Resistivity Values of $MnO_2$ and $Mn_2O_3$ Compared with Ta and Mn.

|  | Resistivity, $\rho$ |
|---|---|
| $MnO_2$ | 2 to 6 $\Omega$-cm |
| $Mn_2O_3$ | $10^5$ $\Omega$-cm |
| Ta | 12 $\mu\Omega$-cm |
| Mn | 140 $\mu\Omega$-cm |

The uniqueness in this case that $MnO_2$ is richer in oxygen than $Mn_2O_3$, but $Mn_2O_3$ is much more resistive than $MnO_2$. In most oxides, resistivity generally increases with oxygen content.

Another useful outcome of Reaction (1) is the oxygen gas as one of the reaction products. Normally, one wants to avoid gas species as a reaction product, since gas can form bubbles that can break the contact between the oxide and its electrode, thereby causing delamination. In this case, however, the delamination of the electrode is desirable, since it can create an open circuit at the junction to further protect the remaining crossbar array.

FIG. 1 illustrates a perspective view of a memory array, or crossbar, 100 that includes a protective resistor, according to an example. FIG. 1 reveals an intermediate layer 110 disposed between a first, or bottom, layer 106 of approximately parallel conductors 102 and a second, or top, layer 108 of approximately parallel conductors 104. The first layer of conductors may be at a non-zero angle relative to the second layer of conductors to form crosspoints or intersections.

According to one illustrative example, the intermediate layer 110 may be a dielectric layer, such as an insulating layer. A number of the resistance memory devices 112-118 may be formed at the intersections, or junctions, between conductors 102 in the bottom layer 106 and conductors 104 in the top layer 108. The conductors 102, 104 may serve as the bottom and top electrodes. For example, when forming a non-volatile memory device, such as a resistance memory device, the conductors 102 in the bottom layer 106 may be formed from a conductive material, such as copper, aluminum, or the like, and the conductors 104 in the top layer 108 may be formed from the conductive material, which may be the same or different as the bottom layer 106.

To avoid complicating FIG. 1, the individual layers of the resistance memory devices 112-118 are not shown. However, FIG. 2, described below, provides more structural detail of the resistance memory devices 112-118 with the protective resistor in series therewith. FIGS. 5A-5C provide further alternative examples of structures.

For purposes of illustration, only a few of the resistance memory devices 112-118 are shown in FIG. 1. Each of the devices 112-118 may be used to represent one or more bits of data. For example, in the simplest case, a resistance memory device may have two states: a low resistance state and a high resistance state. The low resistance state may represent a binary "1" and the high resistance state may represent a binary "0", or vice versa. Binary data may be written into the nanowire memory array 100 by changing the resistance state of the matrix within the resistive memory devices. The binary data can then be retrieved by sensing the resistance state of the resistive memory devices 112-118. Such writing and sensing may be done using appropriate circuitry (not shown).

FIG. 2 is a cross-sectional view of a resistance memory device 200, such as used as one of the resistance memory devices 112-118, according to an example. In a specific configuration, this may be referred to as a memristor/$MnO_2$ bilayer device, and is the basic version. Other versions are illustrated in FIGS. 5A-5C.

Resistance memory device 200 may have a bottom electrode 202, a top electrode 204, and an active region 206 sandwiched between the bottom electrode and the top electrode. As noted above, resistance memory device 200 may correspond to one of the resistance memory devices 112-118 shown in FIG. 1. Further, bottom electrode 202 and top electrode 204 may correspond to conductors 102 in bottom layer 106 and to conductors 104 in top layer 108 of FIG. 1, respectively.

Bottom electrode 202 may be formed as a layer on a dielectric layer (not shown), defined lithographically, and etched so as to form separate conductor lines, such as conductors 102 in FIG. 1. Examples of materials for electrodes 202 include, but are not limited to, aluminum (Al), copper (Cu), platinum (Pt), tungsten (W), gold (Au), titanium (Ti), silver (Ag), ruthenium dioxide ($RuO_2$), titanium nitride (TiN), tungsten nitride ($WN_2$), tantalum (Ta), hafnium nitride (HfN), niobium nitride (NbN), tantalum nitride (TaN), and the like. The thickness of the electrode 202 may be in the range of about 10 nm to a few micrometers (e.g., about 2 to 3 micrometers). Examples of forming the bottom electrode 202 include, but are not limited to, electroplating, sputtering, evaporation, ALD (atomic layer deposition), co-deposition, chemical vapor deposition, IBAD (ion beam assisted deposition), oxidation of pre-deposited materials, or any other film deposition technology. Methods for defining the bottom electrode 202 lithographically may be conventional. Etching for lithographic definition may be performed by plasma dry etching.

Active layer 206 may be formed over the bottom electrode 202, defined lithographically, and etched. The active layer 206, also called the switching layer, is so called because it supports switching between two (or more) states, "low" resistance and "high" resistance, and thus between "ON" and "OFF", respectively. By "low" and "high" resistance is meant the relative resistance of the active layer 206, where "low" and "high" are relative terms. Typically, the difference in resistance is on the order of at least one order of magnitude, or 10 fold. It is within the active layer 206 that one (or more) conducting channel(s) (not shown) may be formed. Examples of suitable materials for forming the active layer 206 include the oxides and nitrides listed above. Examples of forming the active layer 206 include, but are not limited to, e-beam deposition, sputter deposition, atomic layer deposition (ALD), and the like. Methods for defining the active layer 206 lithographically may be conventional. Etching for lithographic definition may be performed by plasma dry etching.

Top electrode 204 may formed over the active layer 206, defined lithographically, and etched. Examples of suitable metals for forming the top electrode 204 are selected from the same list as those used for forming the bottom electrode 202, and may be the same or different. The thickness of the top electrode 204 may be in the same range as for the bottom electrode 202. Examples of forming the top electrode 204 may be the same as those for forming the bottom electrode 202. Methods for defining the top electrode 204 lithographically may be conventional. Etching for lithographic definition may be performed by plasma dry etching.

As described above, a layer of $MnO_2$ 208 may be formed between the active layer 206 and the top electrode 204 by first depositing the $MnO_2$ layer on the active layer and then the top electrode on the $MnO_2$ layer. In other examples, a layer of $MnO_2$ may be formed between the active layer 206 and the bottom electrode 202 by first depositing the $MnO_2$ layer on the bottom electrode and then the active layer on the $MnO_2$ layer.

Examples of forming the $MnO_2$ layer 208 include, but are not limited to, e-beam deposition, sputter deposition, atomic layer deposition (ALD), and the like. However, for best control of stoichiometry, sputter deposition may be employed. Methods for defining the $MnO_2$ layer 208 lithographically may be conventional. Etching for lithographic definition may be performed by plasma dry etching or ion etching. In some examples, photolithography, including blanket deposition followed by use of a positive or negative resist and subsequent etching may be employed. In any event, the thickness of the $MnO_2$ layer 208 may be in the range of about 2 nm to 100 nm. In some examples, the thickness of the $MnO_2$ layer 208 may be about 10 nm.

An example of the advantage of using the $MnO_2$ protective resistor 208 in a crossbar array 300 is depicted in FIGS.

3A-3D. In FIGS. 3A-3D, it will be appreciated that only one junction is shown, but that each junction in the crossbar array 300 is similar to the one shown. In the array, a memristor 306 is specifically depicted. However, it will be appreciated that a crossbar array that includes a plurality of resistance memory devices of any type may experience the benefits of using the $MnO_2$ protective resistor at each junction.

FIG. 3A shows an array 300 that includes a resistance memory device 306, here, a memristor, connected to a bottom conductor, or electrode, 302 and to a top conductor, or electrode, 304. Memristor 306 may correspond to resistance memory device 112-118, 200. Bottom conductive electrode 302 may correspond to bottom conductors 102, 202 of FIGS. 1 and 2, respectively. Top conductive electrode 304 may correspond to top conductors 104, 204 of FIGS. 1 and 2, respectively.

Each of FIGS. 3A-3D is shown in perspective. An X-Y-Z diagram 325, shown in FIG. 3A, depicts the dimensionality of each element 302 (Y), 304 (X), and 306, 308, 308', 310 (Z).

FIG. 3B illustrates the effect of a short 310 in memristor 306 in the crossbar array. The entire array is shorted by this failed device.

FIG. 3C is similar to FIG. 3A, but illustrates a memristor 306 in series with a $MnO_2$ resistor 308. In this configuration, $MnO_2$ exhibits a relatively low resistance, about 10,000 times lower than that of $Mn_2O_5$.

FIG. 3D is similar to FIG. 3B, but illustrates the situation when the memristor 306 is shorted to form short 310. When the memristor 306 fails, the joule heat at the junction may automatically transform $MnO_2$ to $Mn_2O_5$, whose resistivity is 4 to 5 orders of magnitude, or 10,000 to 100,000 times, higher than that of $MnO_2$. The higher resistivity resistor is shown at 308'. The byproduct of the reaction, oxygen gas, can also be used to delaminate the electrode 304 to create an open circuit, or highly resistive, at the defective junction, thereby protecting the remaining crossbar array 300.

Figure 4:
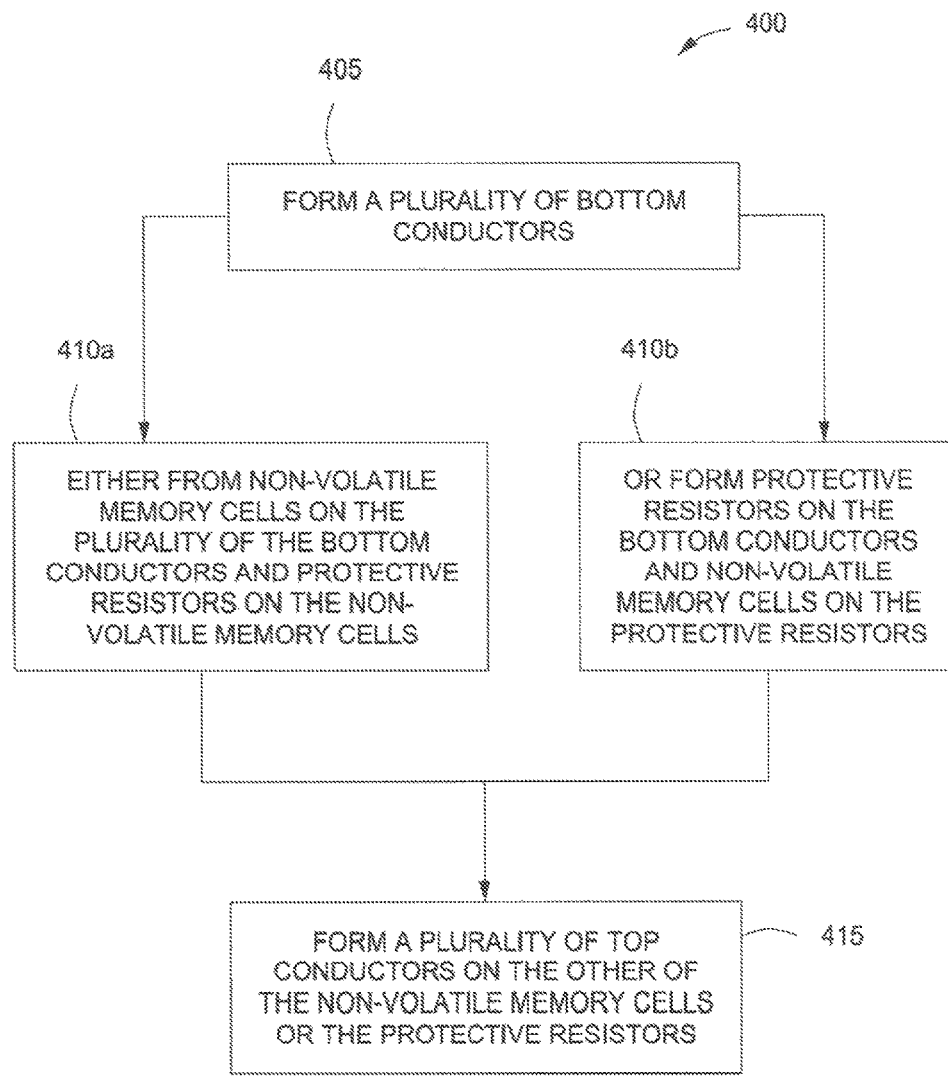
FIG. 4 illustrates a method for manufacturing a crossbar memory array with non-volatile memory cells including protective elements in series therewith, according to an example.

A method 400 of manufacturing the crossbar array 100 is depicted in FIG. 4. The method 400 may include forming 405 the plurality of bottom conductors 102, 202, employing any of the processes disclosed above.

The method 400 may continue with either forming 410a the non-volatile memory cells 112-116, 206 on the plurality of the bottom conductors 102, 202 and the protective resistors 208 on the non-volatile memory cells 112-116, 206, employing any of the processes disclosed above.

Or, the method 400 may alternatively continue with forming 410b the protective resistors 208 on the bottom conductors 102, 202 and the non-volatile memory cells 112-116, 206 on the protective resistors 208, employing any of the processes disclosed above.

The method 400 may conclude with forming 415 a plurality of top conductors on the other of the non-volatile memory cells 112-116, 206 or the protective resistors 208, employing any of the processes disclosed above.

As discussed above, FIG. 2 depicts a basic example of a resistance memory device 200, such as used as one of the resistance memory devices 112-118. FIGS. 5A-5C depict alternate examples of resistance memory devices 225, 250, and 275, respectively, each in cross-section.

The resistance memory device 225 depicted in FIG. 5A may be referred to, in a specific configuration, as a memristor/$MnO_2$ stack-up. Resistance memory device 225 includes a floating electrode 502, interposed between the $MnO_2$ layer 208 and the active layer 206. The electrode 502 is located between the active layer 206 and the $MnO_2$ layer 208 and may serve a number of functions, including, but not limited to, a materials barrier or separator and/or a voltage distributor or spreader. In the former case, the materials barrier or separator means no interaction between memristor, and selector (discussed below), and protector, so that the design of memristor, selector, and protectors can be stacked up or interchanged without too much concern on phase equilibrium and reaction kinetics. In the latter case, memristor current may be focused on a conductive channel, while the selector and protector can be interface-related or bulk-related. Further, the floating electrode 502 may distribute voltage (and perhaps heat) across the device area. The floating electrode 502 may be any of the same metals and thickness range as the bottom and top electrodes 202 and 204, or may have more than one conductive layer. For example, a first conductive layer may be in contact with the memristor 206 to support the memristor function, a second conductive layer may be in contact with the protector 208 to support the protector function, and a third barrier layer may be between the first and the second conductive layer.

The resistance memory device 250 depicted in FIG. 5B may be referred to, in a specific configuration, as a memristor/selector bi-layer/$MnO_2$ stack-up. Memory resistance device 250 includes both the floating electrode 502 and a selector 504 in contact therewith. In this case, the selector 504 is adjacent the active layer 206, while the electrode is adjacent the $MnO_2$ layer 208.

With regard to a memristor crossbar array, the sneak path current can be a big issue. If the memristor's self-nonlinearity is not high enough, a non-linear I-V element called a selector may be added in series with the memristor to reduce sneak path current. The selector itself does no switching (no memory effect), but can be in low resistance at the select voltage (main voltage drop at memristor) and high resistance at the half-select voltage (main voltage drop at selector). Some selectors may use MIT (metal-insulator transition) materials such as $Ti_2O_3$, $VO_2$ or $NbO_2$. The thickness range can be from 2 nm up to about 100 nm.

The resistance memory device 275 depicted in FIG. 5C may be referred to, in a specific configuration, as a memristor/selector/$MnO_2$ stack-up. In this case, the selector 504 is sandwiched between two floating electrodes, 502 and 506, with one of the electrodes in contact with the active layer 206 and the other electrode in contact with the $MnO_2$ layer 208. Two floating electrodes may be used in the memristor/selector/protector stack-up, so that each component element (memristor/selector/protector) can be designed and tested individually and then integrated in series to form a memristor unit cell in the crossbar array. The floating electrode 506 may serve the same function as floating electrode 502, described above. Further, floating electrode 506 may also contain more than one conductive layer, as described above for floating electrode 502. Like floating electrode 502, floating electrode 506 may be any of the same metals and thickness range as the bottom and top electrodes 202 and 204. The metals and thicknesses of the floating electrodes 502, 506 may be the same or different.

The protection of the crossbar memristor array when an individual memristor failed may become more critical as the crossbar array size increases. Increasing the array size will increase the chance that one of its memristor components becomes defective, and protecting the crossbar array from individual memristor failure becomes more important. The $MnO_2$ resistor, and other like resistors, disclosed herein provide that protection.

What is claimed is:

1. A non-volatile memory cell at a crosspoint of a crossbar array including other non-volatile memory cells, the non-volatile memory cell comprising:
    a resistive memory element, the resistive memory element electrically shortable at failure;
    a protective element including a layer of a first oxide thermally convertible to a second oxide having a higher resistivity than the first oxide at the failure of the resistive memory element; and
    a first floating electrode separating the resistive memory element from the protective element.

2. The non-volatile memory cell of claim 1, further comprising:
    a selector interposed between the resistive memory element and the first floating electrode.

3. The non-volatile memory cell of claim 2, further comprising:
    a second floating electrode interposed between the selector and the protective element.

4. The non-volatile memory cell of claim 1, wherein the resistive memory element comprises a memristor cell.

5. The non-volatile memory cell of claim 1, wherein the protective element comprises a layer of MnO2.

6. The non-volatile memory cell of claim 5, wherein the layer of MnO2 has a thickness within a range of about 2 to 100 nm.

7. A crossbar array including:
    a plurality of bottom conductors;
    a plurality of top conductors, the plurality of top conductors crossing the plurality of bottom conductors to form a junction at each crosspoint defined by a bottom conductor and a top conductor;
    a memristor at each junction, each memristor including an active region;
    a protective resistor at each junction in series with each memristor, the protective resistor comprises a layer of Mn02 thermally convertible to a different oxide having a higher resistivity than the Mn02 at failure of the memristor; and
    wherein a first floating electrode separates the active region from the protective resistor.

8. The crossbar array of claim 7, further including a selector interposed between the active region and the first floating electrode.

9. The crossbar array of claim 8, further including a second floating electrode interposed between the selector and the protective resistor.

10. A method of manufacturing the crossbar array, comprising:
    forming a plurality of first conductors;
    forming a plurality of non-volatile memory cells on the first conductors;
    forming a plurality of protective resistors on the non-volatile memory cells, each protective resistor corresponding to one of the non-volatile memory cells and comprising a layer of oxide thermally convertible to a different oxide having a higher resistivity than the oxide at failure of the one of the non-volatile memory cells; and
    forming a plurality of second conductors on the protective resistors, the second conductors crossing the first conductors to form a junction at each of a plurality of crosspoints defined by the first conductors and the second conductors,
    wherein, within each non-volatile memory cell, a first floating electrode separates an active region from the protective resistor corresponding to the non-volatile memory cell.

11. The method of claim 10, wherein, within each non-volatile memory cell, a selector is interposed between the active region and the first floating electrode.

12. The method of claim 11, wherein, within each non-volatile memory cell, a second floating electrode is interposed between the selector and the protective resistor.

13. The non-volatile memory cell of claim 1, wherein the resistive memory element has an increased temperature at the failure thereof, the increased temperature sufficient to thermally convert the layer of the first oxide to the second oxide.

14. The non-volatile memory cell of claim 1, wherein the higher resistivity of the second oxide prevents failure of the other non-volatile memory cells at the failure of the resistive memory element.

* * * * *